(12) United States Patent
Jung et al.

(10) Patent No.: US 9,083,379 B2
(45) Date of Patent: Jul. 14, 2015

(54) SYSTEM AND METHOD FOR SYNCHRONIZATION BETWEEN DIGITAL-TO-ANALOG CONVERTERS (DACS) FOR HIGH SPEED SIGNAL PROCESSING

(71) Applicant: Electronics and Telecommunications Research Institute, Daejeon (KR)

(72) Inventors: Soo Yeob Jung, Daejeon (KR); Pan Soo Kim, Daejeon (KR); Joon Gyu Ryu, Daejeon (KR); Deock Gil Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/301,753

(22) Filed: Jun. 11, 2014

(65) Prior Publication Data

US 2015/0061909 A1   Mar. 5, 2015

(30) Foreign Application Priority Data

Sep. 4, 2013   (KR) .......................... 10-2013-0105985

(51) Int. Cl.
*H03M 1/66*   (2006.01)

(52) U.S. Cl.
CPC ................ *H03M 1/662* (2013.01); *H03M 1/66* (2013.01)

(58) Field of Classification Search
CPC ............................... H03M 1/662; H03M 1/66
USPC ........... 341/144, 141, 122; 455/67.16; 331/25
See application file for complete search history.

(56) References Cited

U.S. PATENT DOCUMENTS

| | | | | |
|---|---|---|---|---|
| 5,659,272 | A * | 8/1997 | Linguet ......................... | 332/151 |
| 6,433,722 | B1 * | 8/2002 | Gata et al. ..................... | 341/144 |
| 6,621,434 | B2 * | 9/2003 | Barry et al. ................... | 341/141 |
| 6,924,759 | B2 * | 8/2005 | Wynne et al. ................ | 341/144 |
| 8,289,087 | B2 * | 10/2012 | Katayama et al. ............. | 331/25 |

* cited by examiner

*Primary Examiner* — Brian Young
(74) *Attorney, Agent, or Firm* — William Park & Associates Ltd.

(57) ABSTRACT

Provided is a system and method for synchronization between digital-to-analog converters (DAC) for high speed signal processing. A synchronization method of a multi-DAC apparatus may include: inputting a clock to a multiplexer (MUX) DAC; dividing the clock into a first clock and a second clock; transferring a phase difference between the first clock and the second clock to a D flip-flop; and synchronizing the first clock and the second clock by processing the phase difference.

12 Claims, 5 Drawing Sheets

FIG. 4

| D Flip-Flop | State Diagram | Excitation Table |
|---|---|---|
| D — Q<br>—▷CLK<br>Q' | D=0 ⟲ (Q=0) ⇄ (Q=1) ⟲ D=1<br>D=1 (top), D=0 (bottom) | Q  Q$_{next}$  D<br>0    0    0<br>0    1    1<br>1    0    0<br>1    1    1 |

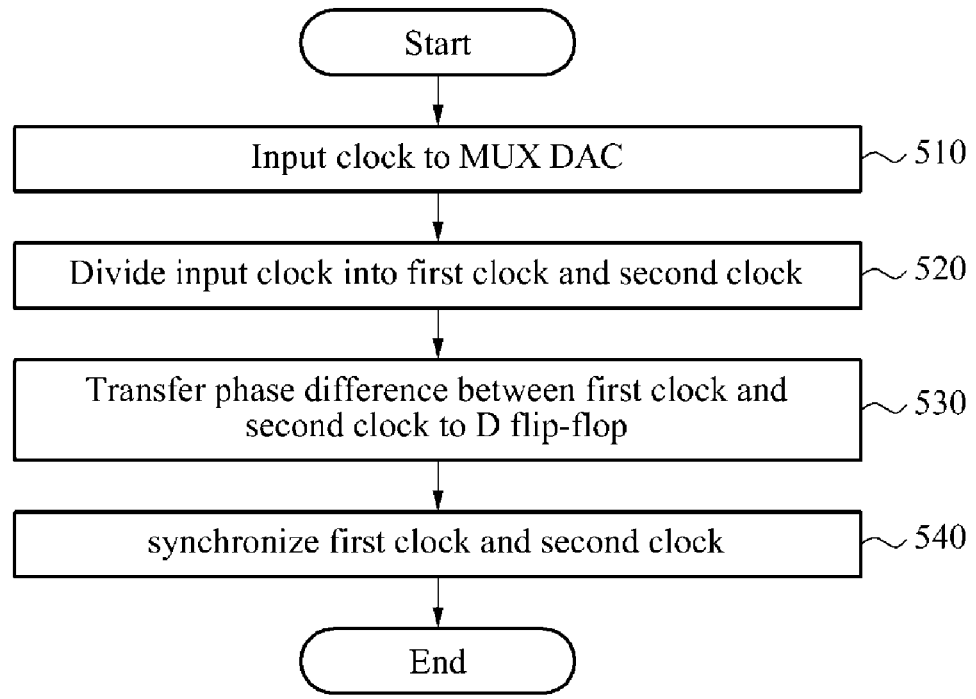

SYSTEM AND METHOD FOR SYNCHRONIZATION BETWEEN DIGITAL-TO-ANALOG CONVERTERS (DACS) FOR HIGH SPEED SIGNAL PROCESSING

CROSS-REFERENCE TO RELATED APPLICATION

This application claims the priority benefit of Korean Patent Application No. 10-2013-0105985, filed on Sep. 4, 2013, in the Korean Intellectual Property Office, the disclosure of which is incorporated herein by reference.

BACKGROUND

1. Field of the Invention Embodiments of the present invention relate to a method and system for synchronization between multiple digital-to-analog converters (DACs) for high speed signal processing.

2. Description of the Related Art

A method of converting a digital signal to an analog signal and carrying and thereby transmitting the converted analog signal to an upper frequency may be employed at an end portion of a general transmitter.

FIG. 1 illustrates a structure of a high speed transmitter according to a related art. A digital-to-analog converter (DAC) and an up-converter configured to perform the aforementioned functionality are provided. To process a high speed signal at a transmitter, a signal input to a DAC may be divided into multiple signals and thereby received through a multiplexer (MUX). Referring to FIG. 1, a 4:1 MUX is employed for the transmitter.

Here, when a clock $f_{CLK}$ is used for a DAC, a data rate of input data that is input to a MUX may be divided based on $f_{CLK}/4$ by a clock divider.

Once a DAC apparatus configured to receive an input via a MUX is powered on, the clock divider may operate in one of different states. In this case, a plurality of DACs may be used to provide in-phase/quadrature phase (I/Q) data as illustrated in FIG. 1. Here, each DAC may use a different clock divider and thus, an asynchronous issue may arise, such as latching of data at different times.

Unless synchronization between multiple DACs is performed, the multiple DACs may output delayed data, leading to a phase distortion.

SUMMARY

Embodiments of the present invention are conceived to solve an asynchronous issue between multiple digital-to-analog converters (DACs) using multiple inputs for high speed signal processing and thus, provide a method and system that may perform a synchronization by adjusting an asynchronous phase in response to detecting a phase distortion occurring when multiple DACs are latching data at different times.

According to an aspect of the present invention, there is provided a synchronization method of a multi-digital-to-analog converter (DAC) apparatus, the method including: inputting a clock to a multiplexer (MUX) DAC; dividing the clock into a first clock and a second clock; transferring a phase difference between the first clock and the second clock to a D flip-flop; and synchronizing the first clock and the second clock by processing the phase difference.

The dividing may include dividing the clock into the first clock and the second clock by alternately using a latching timing of the clock through a clock divider provided in the MUX DAC.

The transferring may include calculating the phase difference between the first clock and the second clock using a phase subtractor.

The phase subtractor may be configured to represent the phase difference as a digital signal every time an operation of the first clock and an operation of the second clock intersect, and to transfer the digital signal to the D flip-flop.

The synchronizing may include outputting a digital clock manager (DCM) clock identical to the first clock and inputting the output DCM clock as a clock of the D flip-flop using a DCM, and gradually delaying the DCM clock.

The DCM clock period may be gradually delayed until an output of the D flip-flop becomes "0".

The synchronization method may further include: calculating the phase difference between the first clock and the second clock based on a number of times that the DCM clock period is delayed; and synchronizing the first clock and the second clock using a phase shifter.

The first clock and the second clock may be used as data clocks.

According to another aspect of the present invention, there is provided a synchronization system of a multi-DAC apparatus, the synchronization system including: a pair of MUX DACs configured to receive a clock, and to divide the clock into a first clock and a second clock; a phase subtractor configured to calculate a phase difference between the first clock and the second clock; a D flip-flop configured to receive the phase difference; and a phase shifter configured to synchronize the first clock and the second clock using an output of the D flip-flop.

The synchronization system may further include a DCM configured to generate a DCM clock to be input as a clock of the D flip-flop. The DCM may be configured to output the DCM clock identical to the first clock, to input the output DCM clock as the clock of the D flip-flop, and to gradually delay a DCM clock period.

EFFECT

According to embodiments of the present invention, an asynchronous issue between multiple DACs using multiple inputs for high speed signal processing may be overcome. Synchronization may be performed by using a phase subtractor, a D flip-flop, and a DCM one by one. Compared to an existing structure of using a plurality of D flip-flops and a plurality of DCMs, a structure of the invention may be simplified and a synchronization procedure may be reduced.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which:

FIG. 4 illustrates an operation table of a D flip-flop provided in a synchronization system according to an embodiment of the present invention; and FIG. 5 is a flowchart illustrating a synchronization method of a multi-DAC apparatus according to an embodiment of the present invention.

DETAILED DESCRIPTION

Figure 1:
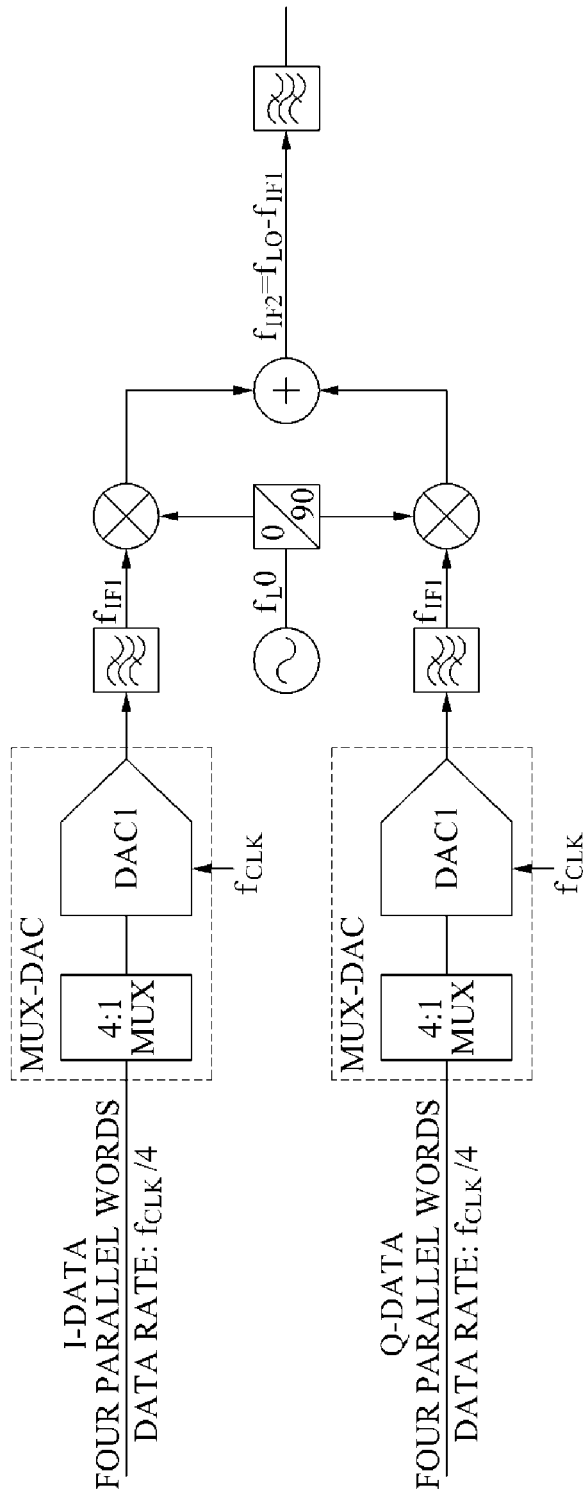
FIG. 1 illustrates a structure of a high speed transmitter including a digital-to-analog converter (DAC) apparatus according to a related art.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Hereinafter, a synchronization system and method between multiple digital-to-analog converters (DACs) using multiple inputs for high speed signal processing will be described with reference to the accompanying drawings.

Disclosed herein is a method and system for synchronizing a signal between multiple DACs using multiple inputs for high speed signal processing.

Figure 2:
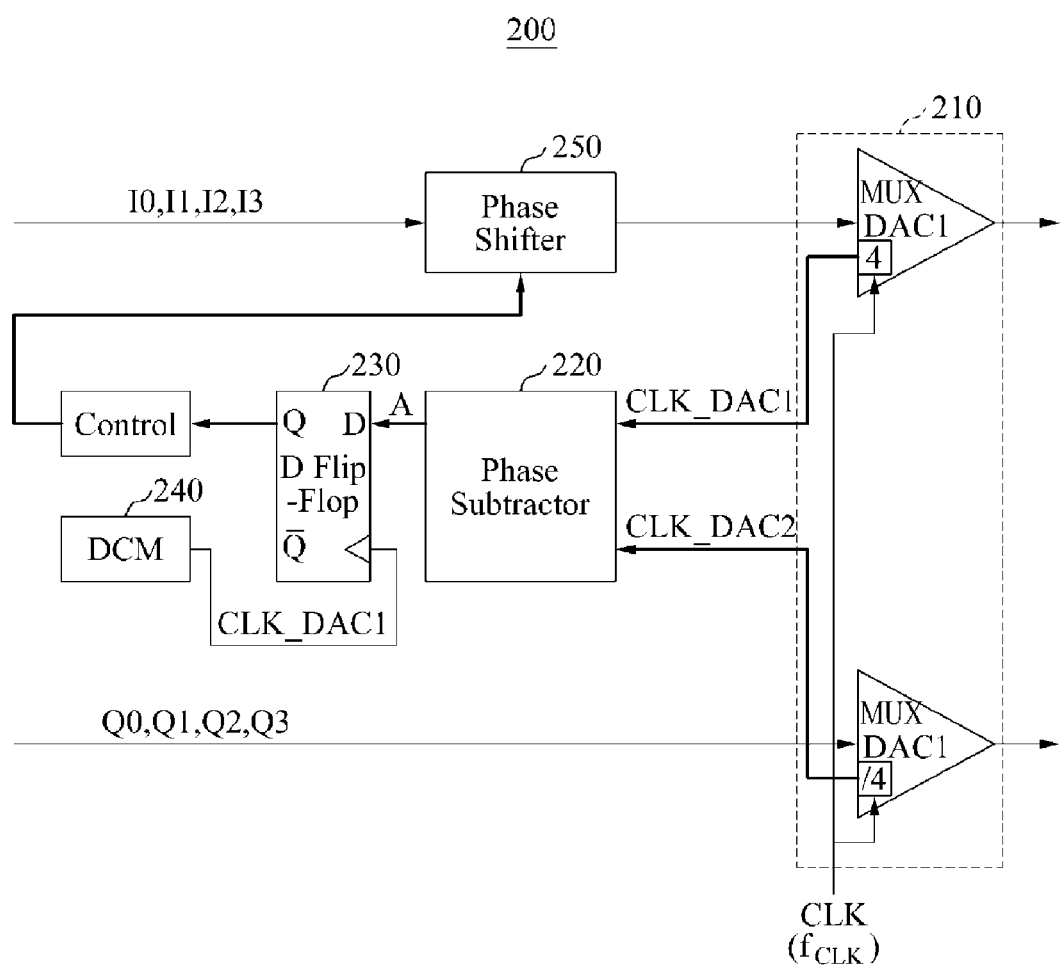
FIG. 2 illustrates a structure of a synchronization system of a multi-DAC apparatus according to an embodiment of the present invention.

FIG. 2 illustrates a structure of a synchronization system 200 of a multi-DAC apparatus according to an embodiment of the present invention. The synchronization system 200 may include a single pair of MUX DACs 210, a phase subtractor 220, a D flip-flop 230, a digital clock manager (DCM) 240, and a phase shifter 250.

The MUX DACs 210 may receive a clock and divide the click into a first clock and a second clock that are two clocks having different latching timings. Here, a clock CLK ($f_{CLK}$) may refer to a clock input from an outside, and the first clock and the second clock divided from the clock may be used as data clocks.

Depending on embodiments, the clock input to the MUX DACs 210 may be divided into the first clock and the second clock through internal clock dividers. Referring to FIG. 2, the first clock refers to CLK_DAC1 and the second clock refers to CLK_DAC2. The first clock and the second clock may be transferred to the phase subtractor 220 to be synchronized. The phase subtractor 220 may recognize a phase difference between the first clock and the second clock, may generate the phase difference as a signal, and may transfer the phase difference to the D flip-flop 230.

The D flip-flop 230 may receive a DCM clock from the DCM 240 and thereby operate. Here, the DCM clock transferred from the DCM 240 may be output in a form identical to the first clock. An operation of the D flip-flop 230 will be further described by referring to the following operation table.

To accurately verify an asynchronous time between the first clock and the second clock, the DCM 240 may gradually delay a DCM clock signal to be transferred to the D flip-flop 230. A criterion for delaying a DCM clock signal may use a signal that is finally output from the D flip-flop 230. An accurate asynchronous time may be calculated based on the final output signal. In addition, the first clock and the second clock may be synchronized based on the calculated accurate asynchronous time.

Depending on embodiments, in a case of delaying a clock, the DCM 240 may delay the clock by each 1/256 based on a clock period. A number of times that the clock is delayed by the DCM 240 may be counted when an output of the D flip-flop 230 reaches a criterion value. Whether to further delay a clock may be determined by receiving an output of the D flip-flop 230 as feedback. A delay time may be accurately calculated by multiplying the number of times that the clock is delayed by "1/256". Accordingly, the phase shifter 250 may solve an asynchronous issue using the delay time. However, the present invention is not limited to the aforementioned embodiment.

When the delay time is transferred to the phase shifter 250, the phase shifter 250 may perform synchronization using the output of the D flip-flop 230. Referring to FIG. 2, synchronization may be adjusted with respect to data I0, I1, I2, and I3 input to MUX DAC1 and data Q0, Q1, Q2, and Q3 input to MUX DAC2. Depending on embodiments, the phase shifter 250 may shift backward or forward at least one of signals, for example, the data I0, I1, I2, and I3, and the data Q0, Q1, Q2, and Q3, having asynchronous phases, based on the input delay time.

Figure 3:
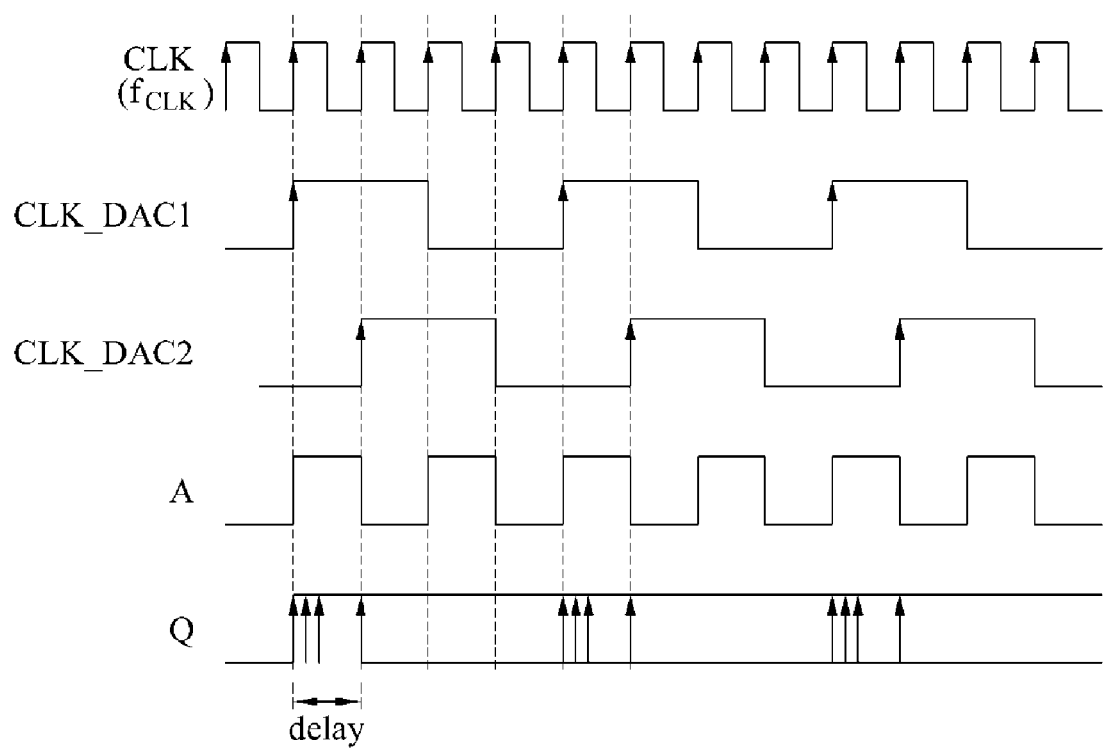
FIG. 3 illustrates a timing diagram appearing in a synchronization structural diagram according to an embodiment of the present invention.

FIG. 3 illustrates a timing diagram appearing in a synchronization structural diagram according to an embodiment of the present invention. Signals of FIG. 3 are associated with signals output from the constituent elements of FIG. 2 and thus, will be described with reference to FIGS. 2 and 3.

A CLK ($f_{CLK}$) signal refers to a clock signal input to the MUX DACs 210. The clock signal may be divided into a first clock and a second clock, such as CLK_DAC1 and CLK_DAC2, at MUX DAC1 and MUX DAC2, respectively. Due to a difference in a clock input time or due to use of different clock dividers, the clock signal may be divided into asynchronous two clocks signal by alternately using latching timings of the clock signal.

According to an embodiment of the present invention, to solve an asynchronous issue between two signals, the phase subtractor 220 may generate an A signal of FIG. 3 by receiving the first clock and the second clock and by calculating a phase difference between two signals, for example, the first clock and the second clock.

The A signal refers to a signal that is generated by comparing a phase between the first clock and the second clock transferred to the phase subtractor 220, and by detecting a change in the clock in real time. Based on vertically indicated dotted lines, phase match and phase mismatch alternately occur and thus, the A signal may be generated. Depending on embodiments, "0" may be output in response to the phase match and "1" may be output in response to the phase mismatch.

FIG. 4 illustrates an operation table of a D flip-flop provided in a synchronization system according to an embodiment of the present invention. Prior to describing a Q signal of FIG. 3, an operation of the D flip-flop will be described.

The D flip-flop may have a configuration of FIG. 4 and may be configured to receive data D and a clock CLK as input and to output an output Q and a reverse output Q'. The D flip-flop may operate as a flip-flop to maintain an input logic value as is. Accordingly, regardless of whether a current state is "0" or "1", subsequent output data is output as "0" when input data is "0" and subsequent output data is output as "1" when input data is "1".

The D flip-flop may not immediately change a current state and instead, may operate when a subsequent clock is input. In this case, the D flip-flop may change or maintain the current state based on a previous input.

Depending on embodiments, referring again to FIG. 2, input data of the D flip-flop 230 may correspond to the signal A generated by the phase subtractor 220 of FIG. 2. In an embodiment in which the A signal is input to the D flip-flop 230 and a clock identical to a first clock is received as a DCM clock, "0" may be output in response to phase match and "1" may be output in response to phase mismatch. Accordingly, referring to an excitation table of FIG. 4, "1" may be continuously output.

Referring to FIG. 4, to synchronize the first clock and the second clock, an output of the Q signal may be adjusted by gradually delaying a DCM clock until an output of the D flip-flop 230 becomes "0". When the DCM clock is gradually delayed to thereby have a form identical to the second clock of FIG. 3, an output of the D flip-flop 230 may be output as "0".

Here, the DCM 240 may count a period of the delayed DCM clock and the number of times that the DCM clock is delayed. Based thereon, an amount of phase delay required to synchronize two clocks may be calculated.

FIG. 5 is a flowchart illustrating a synchronization method of a multi-DAC apparatus according to an embodiment of the present invention. The synchronization method of FIG. 5 may be performed by the synchronization system 200 described above with reference to FIGS. 2 through 4, however, is not limited hereto.

In operation 510, the synchronization system 200 may input a clock to a MUX DAC. A plurality of MUX DACs may be provided. In this case, the synchronization system 200 may simultaneously input the same clock to the plurality of MUX DACs.

In operation 520, the synchronization system 200 may divide the input clock into a first clock and a second clock.

Here, the clock may be divided through a clock divider provided in the MUX DAC and may be divided into the first clock and the second clock by alternately using latching timings of the clock. Depending on embodiments, latching timings such as CLK_DAC1 and CLK_DAC2 of FIG. 3 may be used.

In operation 530, the synchronization system 200 may transfer a phase difference between the first clock and the second clock to a D flip-flop.

The phase difference between the first clock and the second clock may be generated as a signal using a phase shifter. Phase match and phase mismatch alternately occur and thus, an A signal may be generated. Depending on embodiments, "0" may be output in response to the phase match and "1" may be output in response to the phase mismatch.

A phase subtractor may detect that "0" and "1" are alternately output and may transfer a signal to the D flip-flop.

In operation 540, the synchronization system 200 may synchronize the first clock and the second clock with respect to the phase difference. Here, at least one of the first clock and the second clock may be shifted forward or delayed enough to be synchronized.

The D flip-flop may receive the signal and may receive a DCM clock from a DCM. Depending on embodiments, the DCM clock transferred from the DCM may be output as, for example, the first clock. To accurately verify an asynchronous time between the first clock and the second clock, the DCM may gradually delay a DCM clock signal to be transferred to the D flip-flop. The DCM may calculate a delay time and may count a number of times that the DCM clock signal is delayed.

As described above, the D flip-flop may output "0" in response to the phase match and may output "1" in response to the phase mismatch. Therefore, the DCM may gradually delay the DCM clock signal until an output of the D flip-flop is output as "0" to synchronize the first clock and the second clock. Accordingly, the D flip-flop may become aware of a point in time when a phase between the first clock and the second clock is synchronized and may also become aware of an amount of delay time to synchronize the first clock and the second clock.

When the delay time is transferred to the phase shifter, the phase shifter may perform synchronization using an output of the D flip-flop and thereby match synchronization of data input values.

According to embodiments of the present invention, an asynchronous issue between multiple DACs using multiple inputs for high speed signal processing may be overcome. Synchronization may be performed by using a phase subtractor, a D flip-flop, and a DCM one by one. Compared to an existing structure of using a plurality of D flip-flops and a plurality of DCMs, a structure of the invention may be simplified and a synchronization procedure may be reduced.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A synchronization method of a multi-digital-to-analog converter (DAC) apparatus, the method comprising:
    inputting a clock to a multiplexer (MUX) DAC;
    dividing the clock into a first clock and a second clock;
    transferring a phase difference between the first clock and the second clock to a D flip-flop; and
    synchronizing the first clock and the second clock by processing the phase difference.

2. The method of claim 1, wherein the dividing comprises dividing the clock into the first clock and the second clock by alternately using a latching timing of the clock through a clock divider provided in the MUX DAC.

3. The method of claim 1, wherein the transferring comprises calculating the phase difference between the first clock and the second clock using a phase subtractor.

4. The method of claim 3, wherein the phase subtractor is configured to represent the phase difference as a digital signal every time an operation of the first clock and an operation of the second clock intersect, and to transfer the digital signal to the D flip-flop.

5. The method of claim 1, wherein the synchronizing comprises outputting a digital clock manager (DCM) clock identical to the first clock and inputting the output DCM clock as a clock of the D flip-flop using a DCM, and gradually delaying the DCM clock.

6. The method of claim 5, wherein the DCM clock period is gradually delayed until an output of the D flip-flop becomes "0".

7. The method of claim 5, further comprising:
    calculating the phase difference between the first clock and the second clock based on a number of times that the DCM clock period is delayed; and
    synchronizing the first clock and the second clock using a phase shifter.

8. The method of claim 1, wherein the first clock and the second clock are used as data clocks.

9. A synchronization system of a multi-digital-to-analog converter (DAC) apparatus, the synchronization system comprising:
    a pair of multiplexer (MUX) DACs configured to receive a clock, and to divide the clock into a first clock and a second clock;
    a phase subtractor configured to calculate a phase difference between the first clock and the second clock;
    a D flip-flop configured to receive the phase difference; and a phase shifter configured to synchronize the first clock and the second clock using an output of the D flip-flop.

10. The synchronization system of claim 9, further comprising:
a digital clock manager (DCM) configured to generate a DCM clock to be input as a clock of the D flip-flop,
wherein the DCM is configured to output the DCM clock identical to the first clock, to input the output DCM clock as the clock of the D flip-flop, and to gradually delay a DCM clock period.

11. The synchronization system of claim 10, wherein the DCM is configured to gradually delay the DCM clock period until the output of the D flip-flop becomes "0".

12. The synchronization system of claim 11, wherein the phase shifter is configured to calculate the phase difference between the first clock and the second clock based on a number of times that the DCM clock period is delayed, and to synchronize the first clock and the second clock.

* * * * *